United States Patent
Kitaoka

(10) Patent No.: US 9,635,770 B2
(45) Date of Patent: Apr. 25, 2017

(54) SHIELD MEMBER FOR SELECTIVELY SECURING AN ELECTRICAL DEVICE

(71) Applicant: Goodrich Corporation, Charlotte, NC (US)

(72) Inventor: Yasuhide Kitaoka, Hacienda Heights, CA (US)

(73) Assignee: GOODRICH CORPORATION, Charlotte, NC (US)

( * ) Notice: Subject to any disclaimer, the term of this patent is extended or adjusted under 35 U.S.C. 154(b) by 0 days.

(21) Appl. No.: 14/840,825

(22) Filed: Aug. 31, 2015

(65) Prior Publication Data

US 2017/0064849 A1 Mar. 2, 2017

(51) Int. Cl.
*H05K 5/02* (2006.01)
*G06F 1/18* (2006.01)

(52) U.S. Cl.
CPC .......... *H05K 5/0208* (2013.01); *G06F 1/182* (2013.01); *H05K 5/0226* (2013.01); *H05K 5/0239* (2013.01)

(58) Field of Classification Search
CPC combination set(s) only.
See application file for complete search history.

(56) References Cited

U.S. PATENT DOCUMENTS

| | | | |
|---|---|---|---|
| 4,872,139 A | 10/1989 | Okamoto et al. | |
| 5,663,867 A | 9/1997 | Honda et al. | |
| 6,088,221 A * | 7/2000 | Bologna | G06F 1/184 312/223.2 |
| 6,288,902 B1 * | 9/2001 | Kim | G11B 33/08 206/701 |
| 6,529,374 B2 * | 3/2003 | Yamashita | H05K 7/20145 165/80.3 |
| 6,856,508 B2 * | 2/2005 | Rabinovitz | G06F 1/184 248/682 |
| 6,917,570 B2 | 7/2005 | Morisaki | |
| 7,227,744 B2 * | 6/2007 | Kitaoka | G06F 1/182 312/332.1 |
| 7,367,035 B2 * | 4/2008 | Kitaoka | H05K 5/0291 360/98.06 |

(Continued)

FOREIGN PATENT DOCUMENTS

| | | |
|---|---|---|
| EP | 1378857 A1 | 1/2004 |
| EP | 1638382 A2 | 3/2006 |

(Continued)

OTHER PUBLICATIONS

EP SR, Issued Feb. 3, 2017, U380612EP, EP Application No. EP161856246, 6 pages.

*Primary Examiner* — Lisa Lea Edmonds
(74) *Attorney, Agent, or Firm* — Cantor Colburn LLP

(57) ABSTRACT

An electrical component includes a housing having an electrical device receiving slot, and a cover selectively positionable at the electrical device receiving slot. The cover includes an electrical device ejector. A shield member is pivotally mounted to the housing. The shield member is selectively positionable across the electrical device ejector. A shield member control system is operatively connected to the shield member. The shield member control system is operable to release the shield member once communications between the electrical component and an electrical device in the electrical device receiving slot are idle.

20 Claims, 6 Drawing Sheets

(56) References Cited

U.S. PATENT DOCUMENTS

| | | | |
|---|---|---|---|
| 7,656,681 B2* | 2/2010 | Tracewell | H05K 7/20563 361/800 |
| 9,456,531 B2* | 9/2016 | Snider | H04B 1/082 |
| 2004/0223048 A1 | 11/2004 | Shiraishi et al. | |
| 2004/0223294 A1 | 11/2004 | Kitaoka | |
| 2011/0090633 A1* | 4/2011 | Rabinovitz | G06F 1/184 361/679.31 |

FOREIGN PATENT DOCUMENTS

| | | |
|---|---|---|
| EP | 1729245 A2 | 12/2006 |
| KR | 100950938 B1 | 4/2010 |

* cited by examiner

SHIELD MEMBER FOR SELECTIVELY SECURING AN ELECTRICAL DEVICE

BACKGROUND

Exemplary embodiments pertain to the art of electrical devices and, more particularly, to a shield member for selectively securing an electrical device.

Electrical devices, including memory cards, data cards, and the like often times interface with an electrical component. Cards contain a storage medium that may be accessed by the electrical component. In many cases, cards are inserted into slots provided in the electrical component. The slots guide connectors on the card toward, and into alignment with, card receivers. Once connected with the card receiver, data may be transferred between the storage medium of the card and the electrical component.

If the card is removed while being accessed by the electrical component, data may be corrupted, or the storage medium could be damaged. Therefore, it is advantageous to remove the card during periods of inactivity. In order to provide some level of protection, prior art systems employ a lid that covers the card. The lid is connected to a sensor. If the lid is opened, the sensor triggers a switch that stops any access activity. While providing some measure of protection, a user may still remove the card prior to activity coming to an end.

BRIEF DESCRIPTION

Disclosed is an electrical component including a housing having an electrical device receiving slot, and a cover selectively positionable at the electrical device receiving slot. The cover includes an electrical device ejector. A shield member is pivotally mounted to the housing. The shield member is selectively positionable across the electrical device ejector. A shield member control system is operatively connected to the shield member. The shield member control system is operable to release the shield member once communications between the electrical component and an electrical device in the electrical device receiving slot are idle.

Also disclosed is a method of removing an electrical device from an electrical component including inserting the electrical device into an electrical device receiving slot of the electrical component, initiating communications between the electrical device and the electrical component, stopping communications between the electrical component and the electrical device, releasing a shield member only after communications between the electrical component and the electrical device have stopped thereby exposing an electrical device ejector, activating the electrical device ejector, and removing the electrical device from the electrical component.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Figure 1:
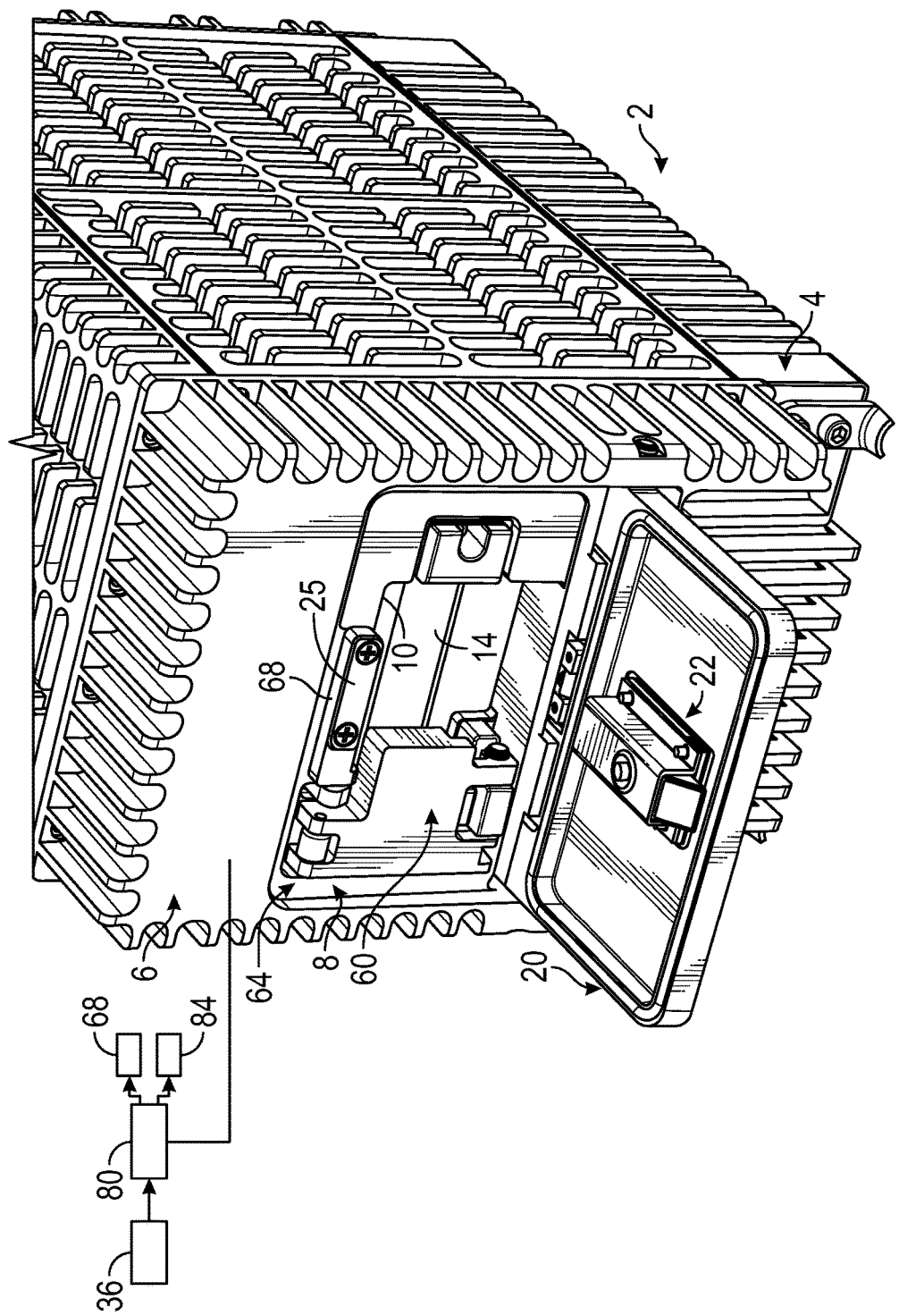
FIG. 1 is partial perspective view of an electrical component, in accordance with an exemplary embodiment, having an electrical device mounted in an electrical device slot.

An electrical component, in accordance with an exemplary embodiment, is illustrated generally at 2, in FIG. 1. Electrical component 2 includes a housing 4 having a side portion 6. Side portion 6 includes a recess 8 within which is positioned an electrical device receiving slot 10. As will be detailed more fully below, electrical device receiving slot 10 receives an electrical device 14 that interfaces with electrical component 2. In accordance with an aspect of an exemplary embodiment, electrical component 2 includes a door 20 that is pivotally mounted across recess 8. Door 20 includes a latch 22 that interfaces with a latching portion 25 arranged within recess 8.

Figure 2:
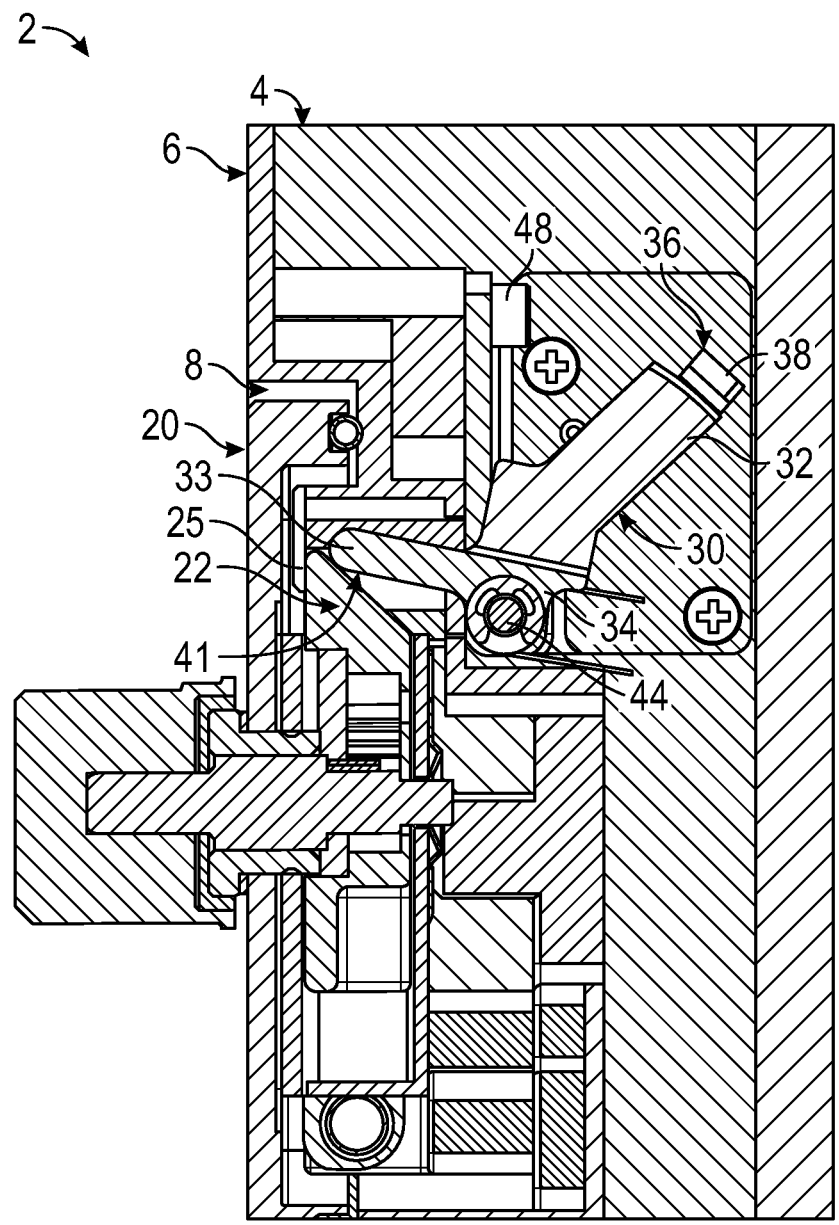
FIG. 2 depicts a partial cross-sectional side view of the electrical component of FIG. 1 showing a door engaging with a door position detector in a first position, in accordance with an aspect of an exemplary embodiment.
Figure 3:
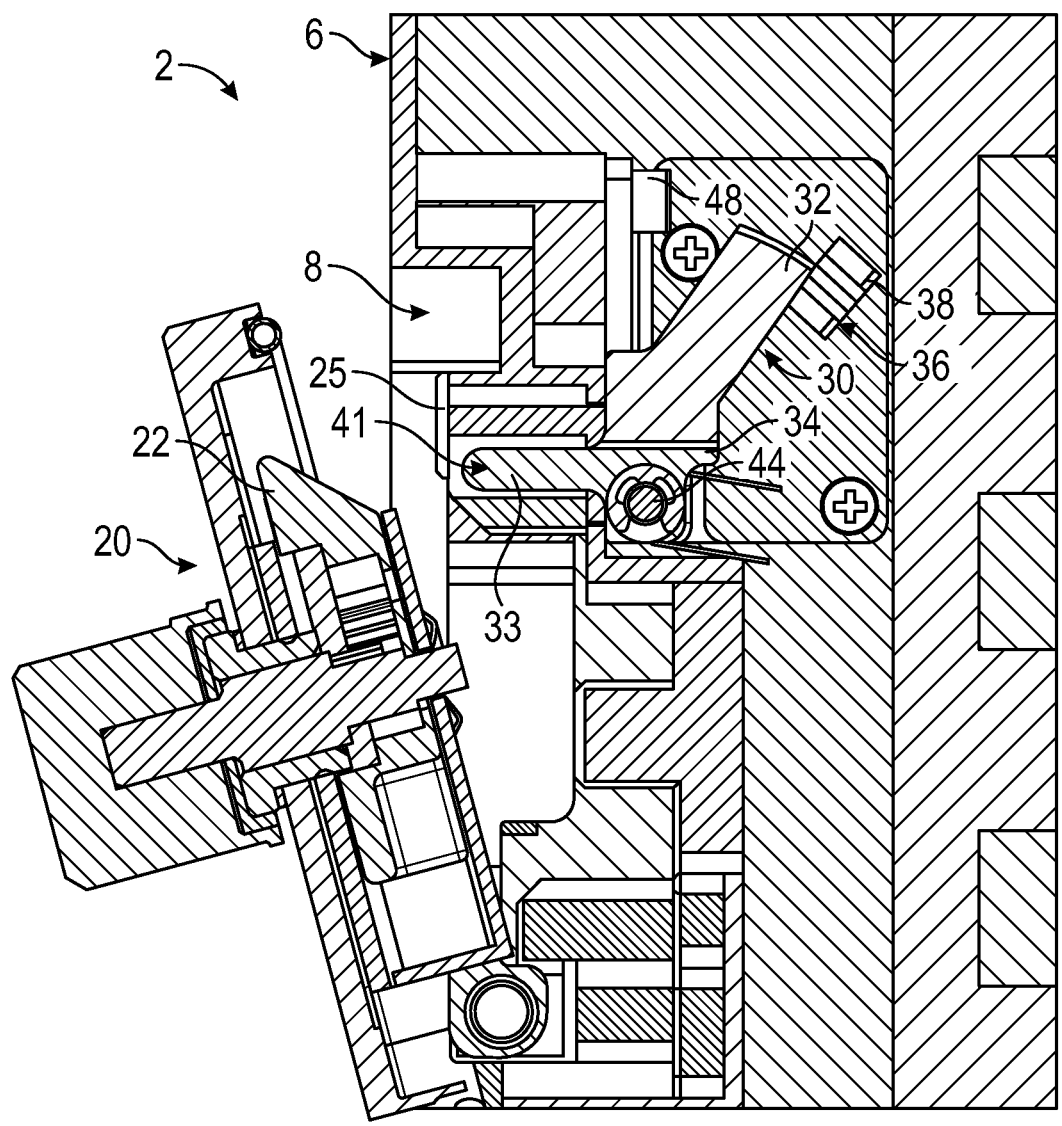
FIG. 3 depicts a partial cross-sectional side view of the electrical component of FIG. 1 showing a door engaging with a door position detector in a second position, in accordance with an aspect of an exemplary embodiment.

In accordance with an aspect of an exemplary embodiment illustrated in FIGS. 2-3, electrical component 2 includes a door position detector 30 mounted within housing 4. As will be detailed more fully below, door position detector 30 senses whether door 20 is open, such as shown in FIG. 1, or whether door 20 is in a closed position, as shown in FIG. 2. Door position detector 30 includes a first end 32, a second end 33, and an intermediate portion 34 extending therebetween. First end 32 includes a door position sensor 36 that may take the form of a photo detector 38, and second end 33 defines a latch engagement member 41. Of course, it should be understood, that other types of sensors may be employed.

Intermediate portion 34 defines a pivot section 44 of door position detector 30. In operation, door 20 is closed and latch 22 engages with latching portion 25. In accordance with an aspect of an exemplary embodiment, closing door 20 may result in latch 22 engaging with latching portion 25. That is, door 20 may act upon a torsion spring (not shown) operatively associated with latch 22 to facilitate engagement with latching portion 25. In accordance with another aspect of an exemplary embodiment, closing door 20 may also initiate communications between electrical device 14 and electrical component 2. Latch 22 also acts upon door position sensor 36, as seen in FIG. 2. Opening door 20, as shown on FIG. 3, disengages latch 22 from door position detector 30. First end 32 pivots about pivot section 44 shifting/rotating door position sensor 36. Photo detector 38 is exposed to light passing through a photo pathway 48 indicating that door 20 is open. As will be detailed more fully below, once door 20 is open, communications between electrical device 14 and electrical component 2 are terminated.

Figure 4:
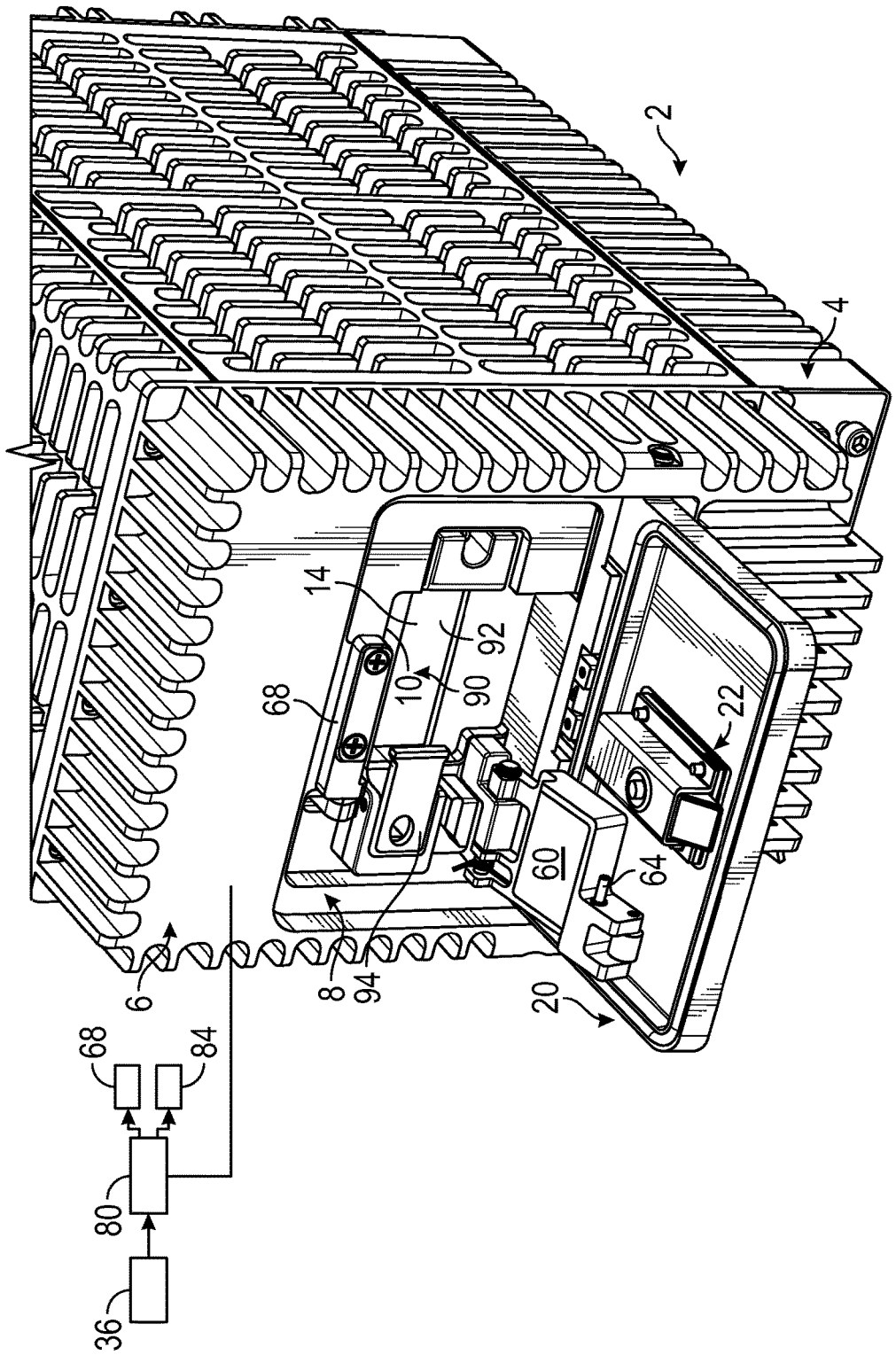
FIG. 4 is a partial perspective view of the electrical component of FIG. 1 showing a shield member exposing an electrical device ejector, in accordance with an aspect of an exemplary embodiment.

In further accordance with an aspect of an exemplary embodiment, electrical component 2 includes a shield member 60 that is selectively pivotally mounted relative to housing 4 between a first position, as shown in FIG. 1, and a second position, such as shown in FIG. 4. In the first position, electrical device 14 is retained within electrical device receiving slot 10 and removal is prevented. In the second position, electrical device 14 may be removed from electrical device receiving slot 10. Shield member 60 includes a latch element 64 that may be retained by a solenoid 68 as will be detailed more fully below.

In still further accordance with an aspect of an exemplary embodiment, electrical component 2 includes a shield member control system 80 operatively connected to solenoid 68. At this point it should be understood that shield member control system 80 may take on a variety of forms including electronic components such as relays and/or integrated circuits, as well as other forms of electrical components. Shield member control system 80 is also operatively connected to door position sensor 36 and circuit components, indicated generally at 84, that control communications between electrical device 14 and electrical component 2. For example, shield member control system 80 may initiate communications once electrical device 14 is detected in electrical device receiving slot 10, and door 20 is sensed as being in a closed position. Upon receiving a signal that door 20 has opened through door position sensor 36, shield member control system 80 signals circuit components 84 to cease communications between electrical device 14 and electrical component 2. Once communications have terminated between electrical device 14 and electrical component 2, shield member control system 80 actuates solenoid 68 to release latch element 64 releasing shield member 60 allowing electrical device 14 to be removed.

Figure 5:
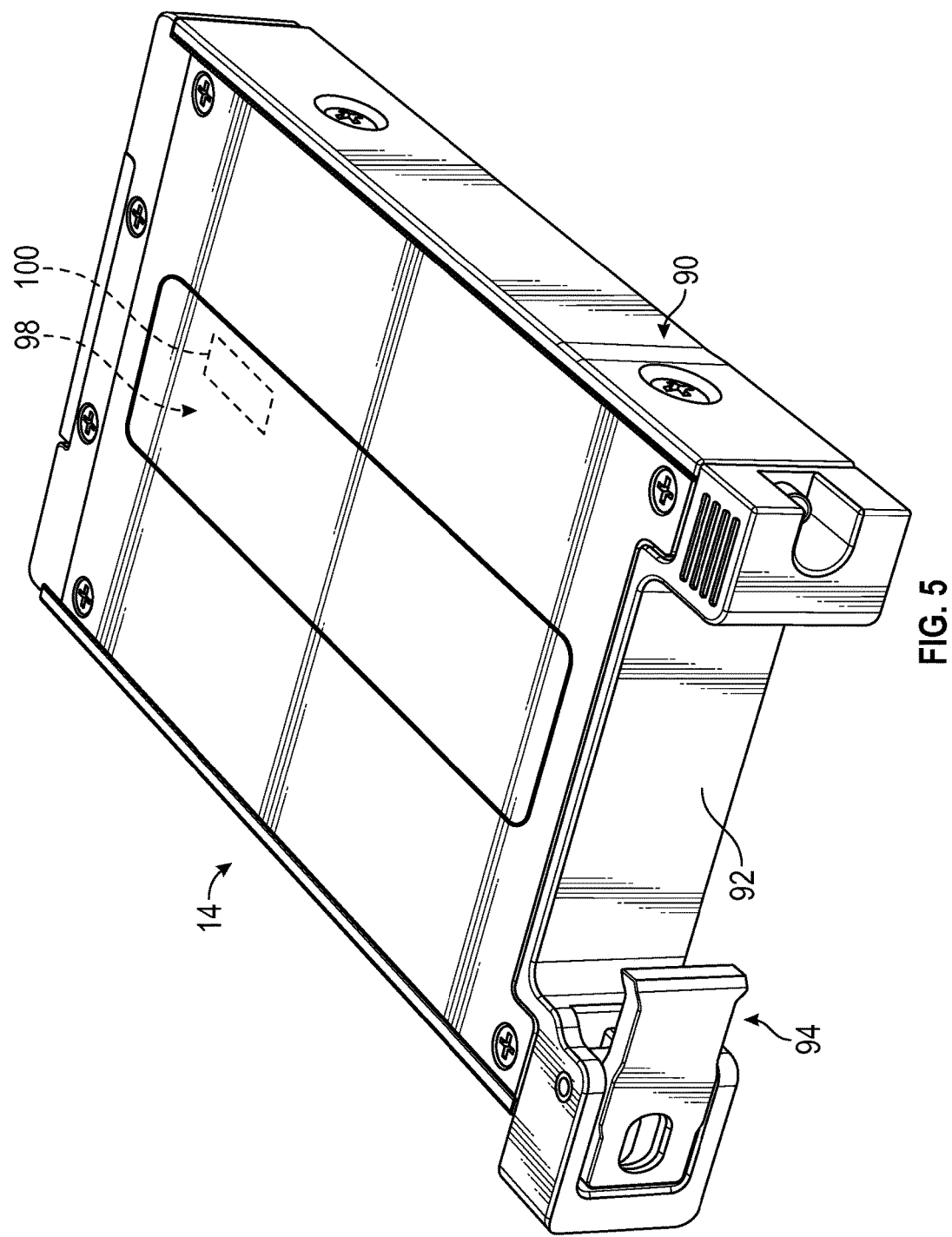
FIG. 5 depicts an electrical device in an electrical device casing, in accordance with an exemplary embodiment.
Figure 6:
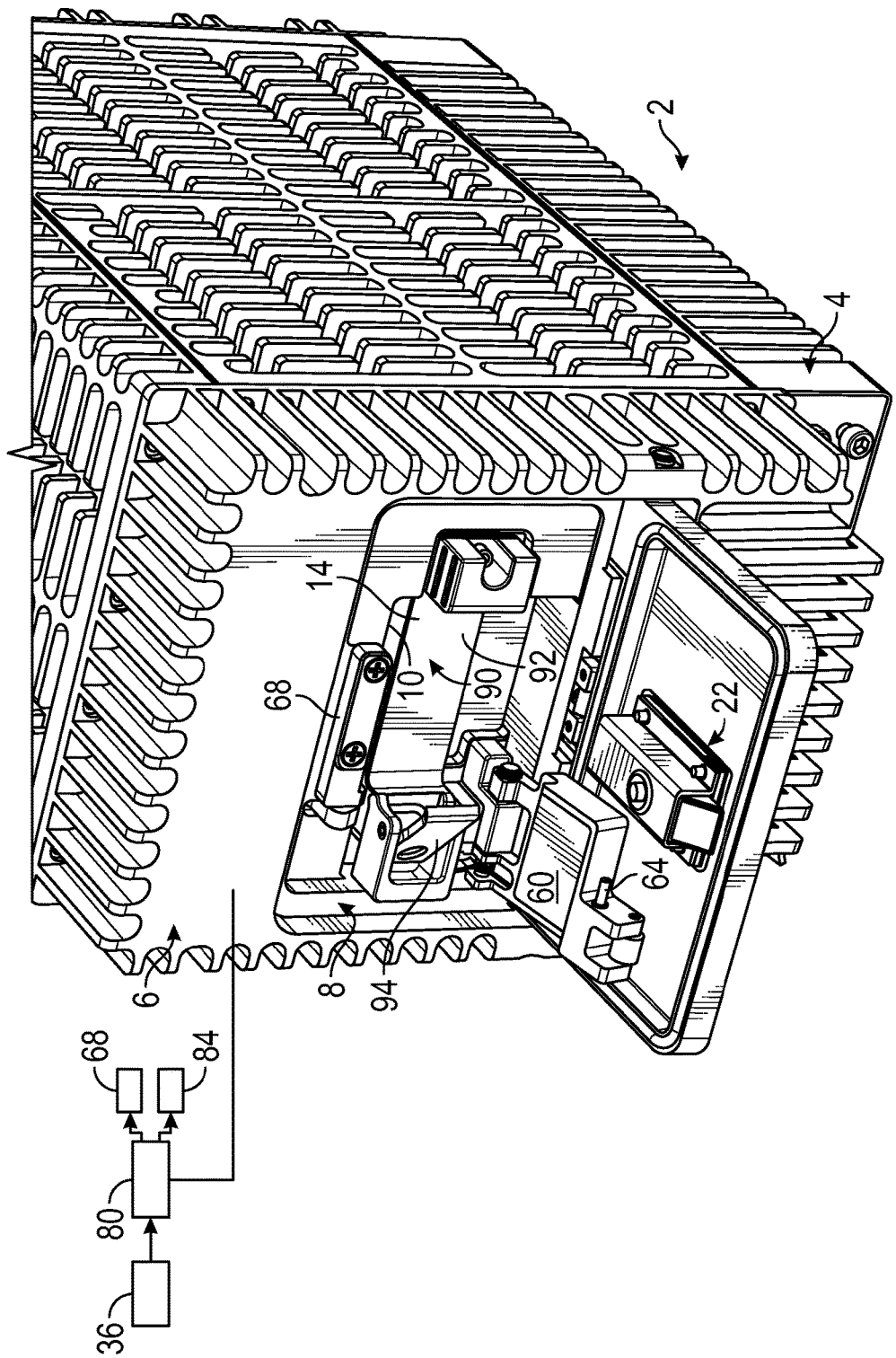
FIG. 6 depicts the electrical component of FIG. 1 with the shield member in an open position and an electrical device ejector in an activated position, in accordance with an aspect of an exemplary embodiment.

In accordance with an aspect of an exemplary embodiment, electrical device 14 includes an electrical device case 90, such as shown in FIG. 5. Electrical device case 90 includes a cover 92 having an electrical device ejector 94 that is selectively covered by shield member 60. Once shield member 60 is opened, electrical device ejector 94 may be manipulated, as shown in FIG. 6, to eject electrical device 14 from electrical device receiving slot 10. In this manner, electrical device 14, which may take the form of a memory card 98 having a storage medium 100, may be safely removed from electrical component 2.

At this point it should be understood that exemplary embodiments describe a system that ensures that communications between an electrical device, such as a memory card, and an electrical component, such as a card reader, a computer, and the like are terminated prior to providing access to remove the electrical device. Further, by locking a shield member with a solenoid in a de-energized state, wear and tear of the solenoid can be reduced and an overall operational life of the system extended. Further, by providing a case with an ejector receptive of an electrical device, unit costs may be reduced. That is, a user may simply purchase an electrical device that may interface with the case without the need to purchase multiple cases.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. An electrical component comprising:
   a housing having an electrical device receiving slot;
   a cover selectively positionable at the electrical device receiving slot, the cover including an electrical device ejector;
   a shield member pivotally mounted to the housing, the shield member being selectively positionable across the electrical device ejector; and
   a shield member control system operatively connected to the shield member, the shield member control system being operable to release the shield member once communications between the electrical component and an electrical device in the electrical device receiving slot are idle.

2. The electrical component according to claim 1, further comprising: a door pivotally mounted to the housing, the door being selectively positionable across the electrical device receiving slot.

3. The electrical component according to claim 2, further comprising: a door position detector configured and disposed to detect a position of the door.

4. The electrical component according to claim 3, further comprising: a latch mounted to the door, the latch being configured to engage with the housing to retain the door across the electrical device receiving slot.

5. The electrical component according to claim 4, wherein the door position detector includes a first end, a second end, and an intermediate portion defining a pivot section, the second end defining a latch engagement member.

6. The electrical component according to claim 5, wherein the first end of the door position detector includes a door position sensor.

7. The electrical component according to claim 6, wherein the door position sensor comprises a photo detector.

8. The electrical component according to claim 1, further comprising: a solenoid mounted to the housing at the shield member.

9. The electrical component according to claim 8, wherein the shield member includes a latch element selectively connected to the solenoid.

10. The electrical component according to claim 8, wherein the solenoid is selectively disengageable from the latch element upon being energized.

11. The electrical component according to claim 1, wherein the cover defines an electrical device case.

12. The electrical component according to claim 11, further comprising: an electrical device including a storage medium arranged in the electrical device case.

13. The electrical component according to claim 12, wherein the electrical device comprises a memory card.

14. A method of removing an electrical device from an electrical component comprising:
- inserting the electrical device into an electrical device receiving slot of the electrical component;
- initiating communications between the electrical device and the electrical component;
- stopping communications between the electrical component and the electrical device;
- releasing a shield member only after communications between the electrical component and the electrical device have stopped thereby exposing an electrical device ejector;
- activating the electrical device ejector; and
- removing the electrical device from the electrical component.

15. The method of claim 14, further comprising: closing a door covering the electrical device and the electrical device receiving slot.

16. The method of claim 15, wherein closing the door includes moving a shield member into a closed configuration locking the electrical device in the electrical device receiving slot.

17. The method of claim 15, wherein initiating communications between the electrical device and the electrical component includes closing the door.

18. The method of claim 14, wherein stopping communications includes opening a door covering the shield member, and activating a door position detector incorporated into a latch.

19. The method of claim 18, wherein activating the door position detector includes exposing the door position detector to light.

20. The method of claim 14, wherein releasing the shield member includes mechanically disengaging a latch element provided on the shield member by energizing a solenoid.

\* \* \* \* \*